(12) United States Patent
Sun et al.

(10) Patent No.: US 12,484,426 B2
(45) Date of Patent: Nov. 25, 2025

(54) DISPLAY PANEL HAVING LIGHT TRANSMISSIVE DISPLAY REGION, METHOD FOR MANUFACTURING THE SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kuo Sun, Beijing (CN); Jundan Zhou, Beijing (CN); Guoqiang Tang, Beijing (CN); Liang Xia, Beijing (CN); Euiku Lee, Beijing (CN); Xucong Wang, Beijing (CN); Miaomiao Song, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/922,023

(22) PCT Filed: Oct. 27, 2021

(86) PCT No.: PCT/CN2021/126842
§ 371 (c)(1),
(2) Date: Oct. 28, 2022

(87) PCT Pub. No.: WO2023/070408
PCT Pub. Date: May 4, 2023

(65) Prior Publication Data
US 2024/0224763 A1    Jul. 4, 2024

(51) Int. Cl.
*H10K 59/80* (2023.01)
*H10K 59/12* (2023.01)
(Continued)

(52) U.S. Cl.
CPC ..... *H10K 59/8792* (2023.02); *H10K 59/1201* (2023.02); *H10K 59/122* (2023.02);
(Continued)

(58) Field of Classification Search
CPC ............ H10K 59/8792; H10K 50/865; H10K 59/122; H10K 59/38; H10K 59/40; H10K 59/65
See application file for complete search history.

(56) References Cited

U.S. PATENT DOCUMENTS 10,677,968 B2    6/2020    Kim et al.
10,803,285 B2    10/2020   Zhao et al.
(Continued)

FOREIGN PATENT DOCUMENTS

CN    107887411 A    4/2018
CN    108288681 A    7/2018
(Continued)

OTHER PUBLICATIONS

English translation of CN111682048A, submitted in the Information Disclosure Statement filed Apr. 24, 2023, 23 pages.
(Continued)

*Primary Examiner* — Nduka E Ojeh
(74) *Attorney, Agent, or Firm* — XSENSUS LLP

(57) ABSTRACT

Provided is a display panel. The display panel includes a substrate, a display layer and a color filter layer; wherein the display layer is disposed on a side of the substrate and includes a plurality of light emitting devices; the color filter layer is disposed on a side, distal from the substrate, of the display layer; and the substrate comprises a light transmis-
(Continued)

sive display region; and in the light transmissive display region, at least a partial region of the display panel disposed between the adjacent light emitting devices is light transmissive.

18 Claims, 7 Drawing Sheets

(51) Int. Cl.
  *H10K 59/122* (2023.01)
  *H10K 59/38* (2023.01)
  *H10K 59/40* (2023.01)
  *H10K 59/65* (2023.01)
(52) U.S. Cl.
  CPC ............. *H10K 59/38* (2023.02); *H10K 59/40* (2023.02); *H10K 59/65* (2023.02)

(56) References Cited

U.S. PATENT DOCUMENTS

| | | | |
|---|---|---|---|
| 11,282,905 B2 | 3/2022 | Park et al. | |
| 2015/0097168 A1 | 4/2015 | Hanawa et al. | |
| 2015/0325629 A1 | 11/2015 | Oooka et al. | |
| 2021/0376003 A1 | 12/2021 | Xu et al. | |
| 2022/0067340 A1* | 3/2022 | Han | G06F 3/042 |
| 2022/0376215 A1 | 11/2022 | Gao et al. | |
| 2023/0026941 A1* | 1/2023 | Lv | H10K 59/80521 |
| 2023/0119532 A1* | 4/2023 | Jeon | G06F 3/0446 |
| | | | 257/40 |
| 2023/0157138 A1* | 5/2023 | Gong | H10K 59/38 |
| | | | 257/91 |
| 2023/0165105 A1* | 5/2023 | Shin | H10K 50/844 |
| | | | 257/40 |

FOREIGN PATENT DOCUMENTS

| | | |
|---|---|---|
| CN | 109860233 A | 6/2019 |
| CN | 111599846 A | 8/2020 |
| CN | 211238258 U | 8/2020 |
| CN | 111668388 A | 9/2020 |
| CN | 111682048 A | 9/2020 |
| CN | 111697039 A | 9/2020 |
| CN | 111739915 A | 10/2020 |
| CN | 111755617 A | 10/2020 |
| CN | 113113454 A | 7/2021 |
| KR | 10-2020-0072745 A | 6/2020 |

OTHER PUBLICATIONS

English translation of CN111697039A, submitted in the Information Disclosure Statement filed Apr. 24, 2023, 17 pages.
English translation of CN111739915A, submitted in the Information Disclosure Statement filed Apr. 24, 2023, 27 pages.
English translation of CN111755617A, submitted in the Information Disclosure Statement filed Apr. 24, 2023, 21 pages.
English translation of CN113113454A, submitted in the Information Disclosure Statement filed Apr. 24, 2023, 16 pages.
English translation of CN211238258U, submitted in the Information Disclosure Statement filed Apr. 24, 2023, 16 pages.
English translation of KR20200072745A, submitted in the Information Disclosure Statement filed Apr. 24, 2023, 40 pages.
English translation of CN111682048A, submitted in the Information Disclosure Statement filed Apr. 25, 2023, 23 pages.
English translation of CN111697039A, submitted in the Information Disclosure Statement filed Apr. 25, 2023, 17 pages.
English translation of CN111739915A, submitted in the Information Disclosure Statement filed Apr. 25, 2023, 27 pages.
English translation of CN111755617A, submitted in the Information Disclosure Statement filed Apr. 25, 2023, 21 pages.
English translation of CN113113454A, submitted in the Information Disclosure Statement filed Apr. 25, 2023, 16 pages.
English translation of CN211238258U, submitted in the Information Disclosure Statement filed Apr. 25, 2023, 16 pages.
English translation of KR20200072745A, submitted in the Information Disclosure Statement filed Apr. 25, 2023, 40 pages.

* cited by examiner

US 12,484,426 B2

DISPLAY PANEL HAVING LIGHT TRANSMISSIVE DISPLAY REGION, METHOD FOR MANUFACTURING THE SAME, AND DISPLAY DEVICE

CROSS-REFERENCE TO RELATED APPLICATION

This present disclosure is a U.S. national stage of international application No. PCT/CN2021/126842, filed on Oct. 27, 2021, the disclosure of which is herein incorporated by reference in its entirety.

TECHNICAL FIELD

The present disclosure relates to the field of display technology, and in particular relates to a display panel, a method for manufacturing the same, and a display device.

BACKGROUND

An organic light emitting diode (OLED) display panel is a common display panel and is widely used in display devices such as cell phones and tablet computers.

The OLED display panel includes a substrate, a display layer and a color filter layer. The display layer includes structures such as a light emitting device and a pixel definition layer, and is configured to emit light in the display panel. The color filter layer is configured to filter light, which improves the saturation of pictures, and weakens the reflection of ambient light by the anode layer.

SUMMARY

The present disclosure provides a display panel, a method for manufacturing the same, which can increase the screen-to-body ratio of the display devices. The technical solutions are as follows:

According to some embodiments of the present disclosure, a display panel is provided. The display panel includes: a substrate, a display layer and a color filter layer; wherein the display layer is disposed on a side of the substrate and includes a plurality of light emitting devices; the color filter layer is disposed on a side, distal from the substrate, of the display layer; and the substrate includes a light transmissive display region;

wherein in the light transmissive display region, at least a partial region of the display panel disposed between the adjacent light emitting devices is light transmissive.

In some embodiments, the display layer further includes a pixel definition layer, wherein the pixel definition layer includes a body and a plurality of first light shielding blocks, and the body is provided with a plurality of openings which are in one-to-one correspondence with anodes of the light emitting devices; and in the light transmissive display region, an orthographic projection of the anode on the substrate is within an orthographic projection of the corresponding opening on the substrate; at least a portion of the first light shielding block is disposed within the opening, and an orthographic projection of the first light shielding block on the substrate partially overlaps with the orthographic projection of the anode on the substrate.

In some embodiments, an outer contour of the orthographic projection of the anode on the substrate is within the orthographic projection of the first light shielding block on the substrate.

In some embodiments, the first light shielding block is made from a non-light transmissive material; or, the first light shielding block includes a light transmissive body and a non-light transmissive coating, and the non-light transmissive coating is at least disposed on a surface, proximate to and/or distal from the substrate, of the light transmissive body.

In some embodiments, the display layer further includes a pixel definition layer, the pixel definition layer including a body and a first light shielding layer; wherein the body is provided with a plurality of openings which are in one-to-one correspondence with anodes of the light emitting devices and an orthographic projection of the opening on the substrate is within an orthographic projection of the corresponding anode on the substrate;

the first light shielding layer is disposed on a surface, proximate to and/or distal from the substrate, of the body, and an orthographic projection of the first light shielding layer on the substrate partially overlaps with the orthographic projection of the anode on the substrate; and the first light shielding layer includes a plurality of first slits, wherein the first slit is at least disposed in the light transmissive display region and between the adjacent openings; and an orthographic projection of the first slit on the substrate does not overlap with the orthographic projection of the anode on the substrate.

In some embodiments, in the light transmissive display region, the plurality of first slits intersect to form a mesh pattern, and the first light shielding layer is divided by the plurality of first slits intersecting in the mesh pattern for forming a plurality of second light shielding blocks.

In some embodiments, in the light transmissive display region, an outer contour of the orthographic projection of the anode on the substrate is disposed within an orthographic projection of the second light shielding block on the substrate.

In some embodiments, the color filter layer includes a plurality of filter blocks; wherein in the light transmissive display region, at least a partial region between the adjacent filter blocks is a light transmissive region, and an orthographic projection of the light transmissive region on the substrate is at least partially outside the orthographic projection of the anode of the light emitting device on the substrate.

In some embodiments, the color filter layer further includes a second light shielding layer; wherein the second light shielding layer is at least disposed in the light transmissive display region, and between the adjacent filter blocks; the second light shielding layer includes a plurality of second slits, wherein the second slit is at least disposed in the light transmissive display region and between the adjacent filter blocks; an orthographic projection of the second slit on the substrate does not overlap with the orthographic projection of the anode on the substrate.

In some embodiments, in the light transmissive display region, the plurality of second slits intersect to form a mesh pattern, and the second light shielding layer includes a plurality of third light shielding blocks divided by the plurality of second slits intersecting in the mesh pattern.

In some embodiments, in the light transmissive display region, the outer contour of the orthographic projection of the anode on the substrate is within an orthographic projection of the third light shielding block on the substrate In some embodiments, the substrate further includes a non-light transmissive display region; wherein in the non-light transmissive display region, at least a partial region of the pixel definition layer is a non-light transmissive region, and an orthographic projection of the non-light transmissive region on the substrate at least partially overlaps with an orthographic projection of the light emitting device on the substrate.

In some embodiments, the substrate further includes a non-light transmissive display region; wherein in the non-light transmissive display region, at least a partial region of the color filter layer is a non-light transmissive region, and an orthographic projection of the non-light transmissive region on the substrate at least partially overlaps with an orthographic projection of the light emitting device on the substrate.

In some embodiments, the display panel further includes a touch layer; the touch layer is disposed between the display layer and the color filter layer, or disposed on a side, distal from the display layer, of the color filter layer.

According to some embodiments of the present disclosure, the present disclosure further provides a method for manufacturing a display panel, and the method includes.
  providing a substrate, the substrate including a light transmissive display region and a non-light transmissive display region;
  forming a display layer, the display layer being disposed on a side of the substrate and includes a plurality of light emitting devices;
  forming a color filter layer, the color filter layer being disposed on a side, distal from the substrate, of the display layer; wherein in the light transmissive display region, at least a partial region of the display panel disposed between anodes of adjacent light emitting devices is light transmissive.

According to some embodiments of the present disclosure, the present disclosure further provides a display device which includes a camera module and the display panel as defined in the first aspect, wherein the camera module is disposed on a side, distal from the color filter layer, of the substrate, and is opposite to the light transmissive display region of the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description illustrate merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the embodiments of the present disclosure, embodiments of the present disclosure are described in detail hereinafter with reference to the accompanying drawings.

Unless otherwise defined, all the technical and scientific terms used herein have the same meanings as commonly understood by one of ordinary skill in the art to which the present disclosure belongs. The terms "first," "second," "third," etc., which are used in description and claims of the present disclosure, are not intended to indicate any sequence, amount or importance, but distinguish various components. Similarly, the term "a," "an," etc. do not denote a limitation of quantity, but rather denote the presence of at least one of the referenced items. The terms "comprise," "include," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

"On," "under," "right," "left" and the like are only used to indicate relative position relationship, and when the position of the object which is described is changed, the relative position relationship may be changed accordingly.

In the related art, the display device usually also includes a camera, while the camera is usually arranged in a region outside the display panel in order to allow the camera to work properly, so that the display device has a relatively small screen-to-body ratio.

Figure 1:
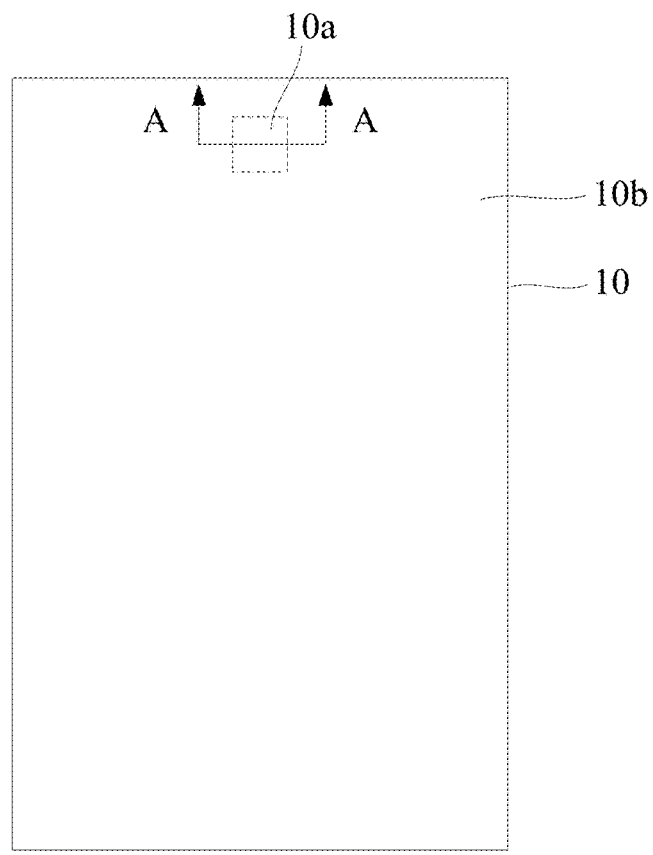
FIG. 1 is a top view of a display panel according to some embodiments of the present disclosure.
Figure 2:
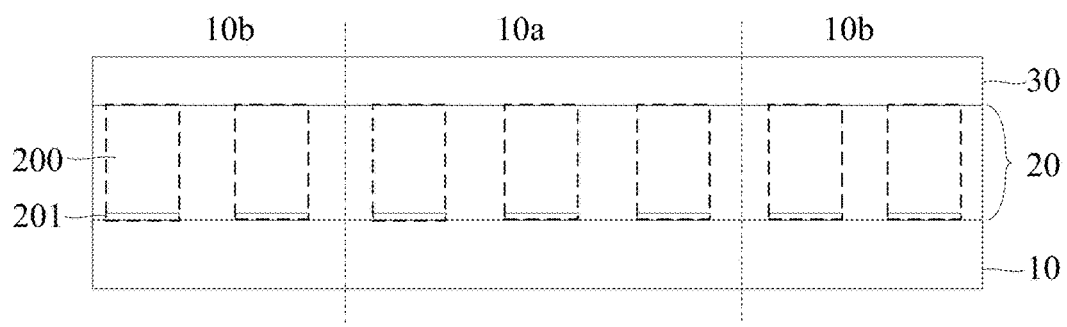
FIG. 2 is a sectional view along A-A in FIG. 1.

FIG. 1 is a top view of a display panel according to some embodiments of the present disclosure. As shown in FIG. 1, the display panel includes a substrate 10 and the substrate 10 includes a light transmissive display region 10a. FIG. 2 is a sectional view along A-A in FIG. 1. As shown in FIG. 2, the display panel further includes a display layer 20 and a color filter layer 30. The display layer 20 is disposed on a side of the substrate 10 and includes a plurality of light emitting devices 200. The color filter 30 is disposed on a side, distal from the substrate 10, of the display layer 20.

In the light transmissive display region 10a, at least a partial region of the display panel disposed between the adjacent anodes 201 in the display layer 20 is light transmissive.

Since in the light transmissive display region, at least a partial region of the display panel disposed between the adjacent light emitting devices is transparent and is capable of transmitting light, the camera is arranged at a position, corresponding to the light transmissive display region, on the back of the display panel when the camera is arranged, which realizes the under-screen camera function and increases the screen-to-body ratio.

Figure 3:
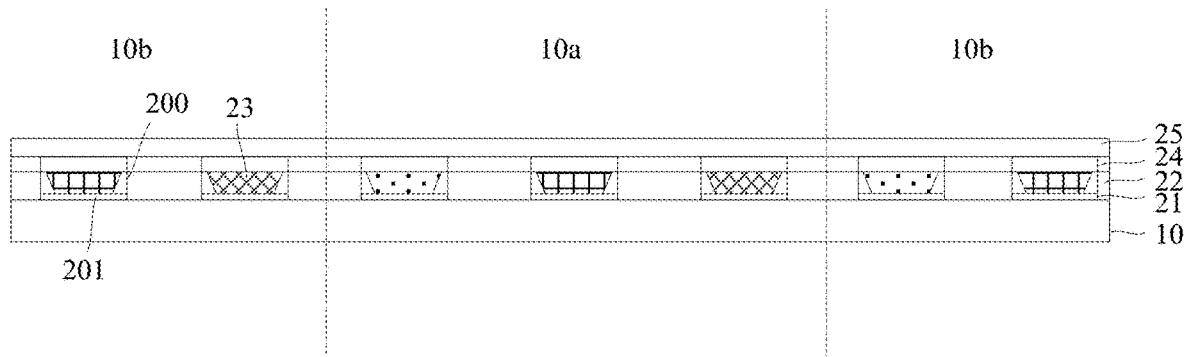
FIG. 3 is a schematic diagram of a partial structure of a display panel according to some embodiments of the present disclosure.

FIG. 3 is a schematic diagram of a partial structure of a display panel according to some embodiments of the present disclosure. The structure of the display layer 20 is illustrated exemplarily in FIG. 3. The structure is shown as an example only and it is not intended to limit the display layer 20 to this one structural form only, or to limit the display layer 20 to necessarily include these layer structures only; in some embodiments, the display layer 20 also includes other layer structures. As shown in FIG. 3, the display layer 20 includes an anode layer 21, a pixel definition layer 22, a plurality of light emitting structures 23, a cathode layer 24, and an encapsulation layer 25. The anode layer 21 includes a plurality of anodes 201 which are arrayed on a side of the substrate 10. The pixel definition layer 22 is disposed on the anode layer 21. The pixel definition layer 22 is provided with pixel openings which correspond to the anodes to expose a partial region of the corresponding anode 201. In some embodiments, the light emitting device 200 is an OLED light emitting device. The light emitting device 200 includes an anode 201, a light emitting structure 23, and a cathode. The cathode is part of the cathode layer 24, and the cathodes of the plurality of light emitting devices 200 are connected. Exemplarily, the light emitting structure 23 includes an electron transport layer, an organic light emitting layer, and a hole transport layer. The light emitting structure 23 is disposed in the pixel opening and on the surface of the anode 201 to be in contact with the anode 201. The cathode layer 24 is disposed on a side, distal from the substrate 10, of the pixel definition layer 22, and the cathode layer 24 is in contact with the light emitting structure 23. The encapsulation layer 25 is disposed on the side, distal from the substrate 10, of the cathode layer 24.

In the embodiments of the present disclosure, at least a partial region, in the light transmissive display region 10a, of the pixel definition layer 22 of the display layer 20 is a light transmissive region, and an orthographic projection of the light transmissive region on the substrate 10 is at least partially outside an orthographic projection of the anode 201 on the substrate 10.

Figure 4:
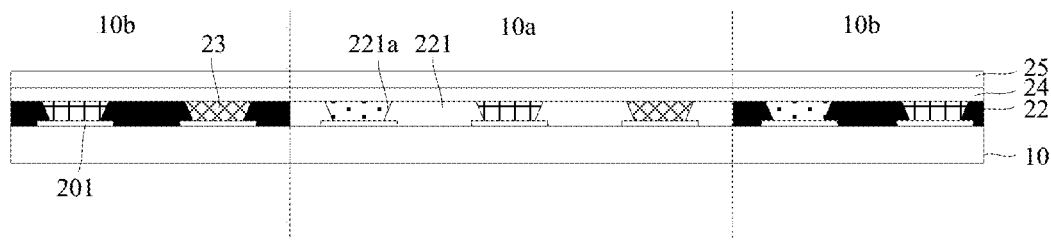
FIG. 4 is a schematic structural diagram of a pixel definition layer according to some embodiments of the present disclosure.

For example, FIG. 4 is a schematic structural diagram of a pixel definition layer according to some embodiments of the present disclosure. As shown in FIG. 4, all the regions of the pixel definition layer 22 in the light transmissive display region 10a are transparent, so that the pixel definition layer 22 does not block ambient light and does not interfere with the normal operation of the under-screen camera.

The pixel definition layer 22 includes a body 221. The body 221 is disposed in the light transmissive display region 10a and the non-light transmissive display region 10b. The body 221 includes a plurality of openings 221a which are in one-to-one correspondence with anodes 201 of the light emitting devices 200. The body 221 is light transmissive.

The substrate 10 further includes a non-light transmissive display region 10b. In the non-light transmissive display region 10b, the pixel definition layer 22 is fully transparent, partially transparent or fully non-transparent.

As an example, the pixel definition layer 22 shown in FIG. 4 is fully non-transparent in the non-light transmissive display region 10b.

In some embodiments of the present disclosure, in the non-light transmissive display region 10b, at least a partial region of the pixel definition layer 22 is a non-light transmissive region, and an orthographic projection of the non-light transmissive region on the substrate 10 at least partially overlaps with an orthographic projection of the light emitting device 200 on the substrate 10. In the non-light transmissive display region 10b, the pixel definition layer 22 is non-transparent, which decreases reflection by the anode 201 and avoid glare.

Figure 5:
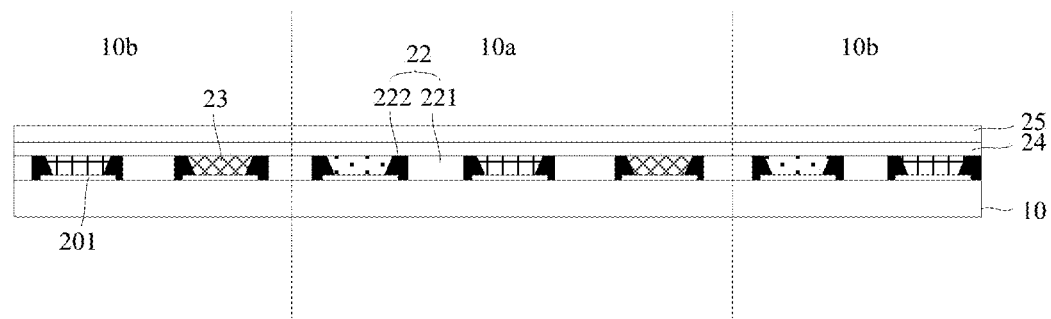
FIG. 5 is a schematic structural diagram of a display layer according to some embodiments of the present disclosure.

FIG. 5 is a schematic structural diagram of a display layer according to some embodiments of the present disclosure. A shown in FIG. 5, in the display layer, the pixel definition layer 22 includes a body 221 and a plurality of first light shielding blocks 222.

In the light transmissive display region 10a, an orthographic projection of the anode 201 of the light emitting device 200 on the substrate is within an orthographic projection of the corresponding opening 221a on the substrate 10. At least a portion of the first light shielding block 222 is disposed within the opening 221a, and an orthographic projection of the first light shielding block 222 on the substrate 10 partially overlaps with the orthographic projection of the anode 201 on the substrate 10.

The first light shielding block 222 disposed in the opening 221a shields the anode 201 to decrease reflection of ambient light by the anode 201 and avoid glare.

Optionally, an outer contour of the orthographic projection of the anode 201 on the substrate 10 is within the orthographic projection of the first light shielding block 222 on the substrate 10.

In the embodiments of the present disclosure, the orthographic projection of the first light shielding block 222 on the substrate 10 ring-shaped, so that the first light shielding block 222 shields a whole circumference of the anode 201 to further avoid the glare phenomenon.

In some embodiments of the present disclosure, the first light shielding block 222 is made from a non-light transmissive material. For example, the first light shielding block 222 is made from a non-transparent resin. It is convenient to make the non-light transmissive first light shielding block 222 by directly using the non-transparent resin material.

Figure 6:
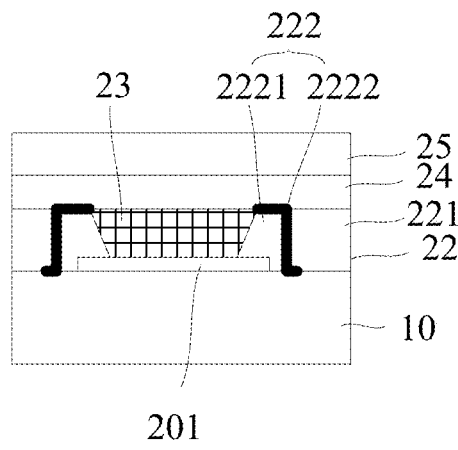
FIG. 6 is a schematic diagram of a partial structure of a display panel according to some embodiments of the present disclosure.

FIG. 6 is a schematic diagram of a partial structure of a display panel according to some embodiments of the present disclosure. In other embodiments of the present disclosure, as shown in FIG. 6, the first light shielding block 222 includes a light transmissive body 2221 and a non-light transmissive coating 2222, and the non-light transmissive coating 2222 is at least disposed on the surface, distal from the substrate 10, of the light transmissive body 2221.

Exemplarily, the non-light transmissive coating 2222 is an ink coating.

As an example, in the embodiments of the present disclosure, the non-light transmissive coating 2222 is disposed on the surface, distal from the substrate 10, of the light transmissive body 2221, and is also disposed on the side wall of the light transmissive body 2221 and on the surface of the substrate 10. In some examples, the non-light transmissive coating 2222 is also disposed on an inner sidewall, proximate to the light emitting structure 23, of the light transmissive body 2221.

In other examples, the non-light transmissive coating 2222 is also disposed on the surface, proximate to the substrate 10, of the light transmissive body 2221.

There are various positions for arranging the non-light transmissive coating 2222, as long as it shields the anode 201 and decreases the reflection of ambient light by the anode 201.

Figure 7:
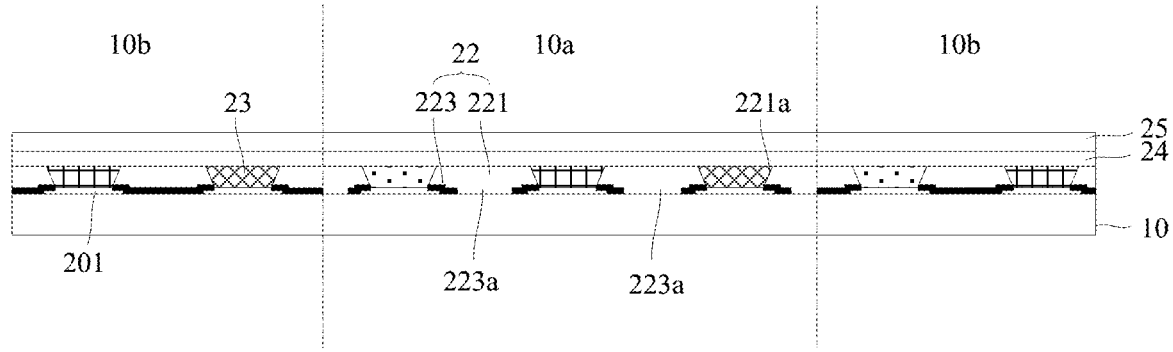
FIG. 7 is a schematic diagram of a partial structure of a display layer according to some embodiments of the present disclosure.

FIG. 7 is a schematic diagram of a partial structure of a display layer according to some embodiments of the present disclosure. As shown in FIG. 7, in the display layer 20, the pixel definition layer includes a body 221 and a first light shielding layer 223. An orthographic projection of the opening 221a on the substrate 10 is within an orthographic projection of the corresponding anode 201 on the substrate 10.

The first light shielding layer 223 is disposed on the surface, proximate to the substrate 10, of the body 221. An orthographic projection of the first light shielding layer 223 on the substrate 10 partially overlaps with the orthographic projection of the anode 201 on the substrate 10. The first light shielding layer 223 includes a plurality of first slits 223a, and the first slit 223a is at least disposed in the light transmissive display region 10a and between the adjacent openings 221a; an orthographic projection of the first slit 223a on the substrate 10 does not overlap with the orthographic projection of the anode 201 on the substrate 10.

The first light shielding layer 223 is non-light transmissive and the first light shielding layer 223 is provided on the surface of the body 221, such that a partial region of the pixel definition layer 22 is non-light transmissive. Thus, the anode 201 is shielded, which decreases the reflection of ambient light by the anode 201 and avoid glare. In the light transmissive display region 10a, the ambient light passes through the first pixel definition layer 22 from the first slit 223a, and transmits through the region between the adjacent anodes 201, such that the under-screen camera functions properly and realizes the under-screen camera function.

An area of the orthographic projection of the light emitting device 200 disposed in the light transmissive display region 10a on the substrate 10 is less than an area of the orthographic projection of the light emitting device 200 disposed in the non-light transmissive display region 10b on the substrate 10. Therefore, in the light transmissive display region 10a, there is space to arrange the first slit 223a with a larger width, and the total area of the first slits 223a in the light transmissive display region 10a is increased, so that the under-screen camera receives more ambient light and the effect of the under-screen photographing is improved.

In other examples, the first light shielding layer 223 is also disposed on the surface, distal from the substrate 10, of the body 221, or on both the surface, proximate to the substrate 10, of the body 221 and the surface, distal from the substrate 10, of the body 221.

Figure 8:
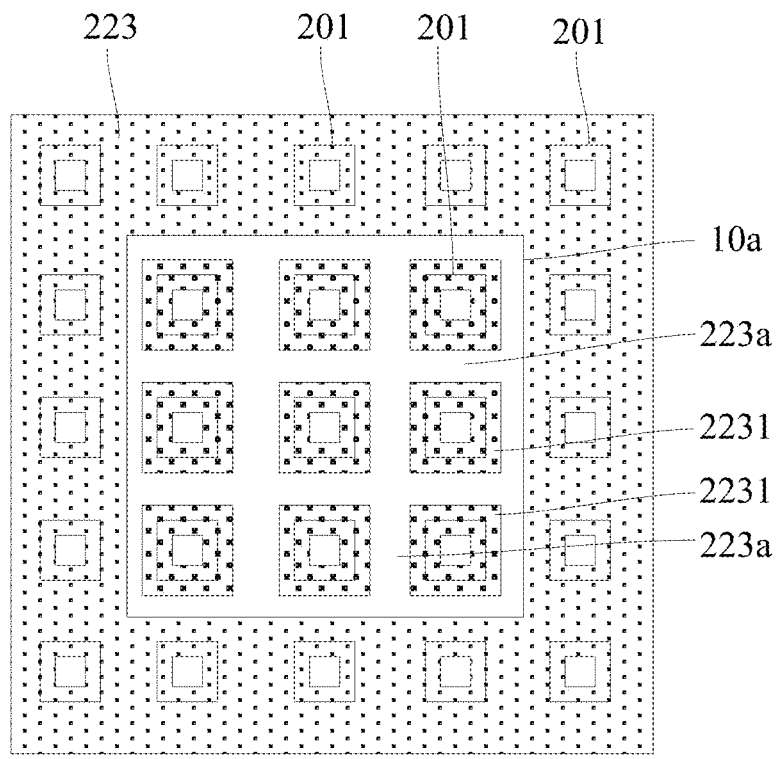
FIG. 8 is a partial top view of a display panel according to some embodiments of the present disclosure.

FIG. 8 is a partial top view of a display panel according to some embodiments of the present disclosure. As shown in FIG. 8, in the light transmissive display region 10a, a plurality of first slits 223a intersect to form a mesh pattern, and the first light shielding layer 223 includes a plurality of second light shielding blocks 2231 divided by the plurality of first slits 223a intersecting in the mesh pattern.

In the light transmissive display region 10a, the second light shielding blocks 2231 are in one-to-one correspondence with the anodes 201 of the light emitting devices 200, and the ambient light passes through the pixel definition layer 22 from the region between the adjacent second light shielding blocks 2231, and the anode 201 is shielded by the second light shielding block 2231 to decrease reflection by the anode 201.

As shown in FIG. 8, in the light transmissive display region 10a, an outer contour of the orthographic projection of the anode 201 of the light emitting device 200 on the substrate 10 is within an orthographic projection of the second light shielding block 2231 on the substrate 10.

In some embodiments of the present disclosure, the orthographic projection of the second light shielding block 2231 on the substrate 10 is ring-shaped, so that the second light shielding block 2231 shields a whole circumference of the anode 201 to further avoid the glare phenomenon.

Exemplarily, the first light shielding layer 223 is a non-light transmissive coating, such as a black ink coating.

Optionally, at least a partial region of the color filter layer 30 is a light transmissive region in the light transmissive display region 10a, and an orthographic projection of the light transmissive region on the substrate 10 is outside the orthographic projection of the anode 201 on the substrate 10. In the embodiments of the present disclosure, at least a partial region of the color filter layer 30 in the light transmissive display region 10a is set to be a light transmissive region, and the orthographic projection of the light transmissive region on the substrate 10 is outside the orthographic projection of the anode 201 on the substrate 10, such that the color filter layer 30 does not interfere with photographing of the under-screen camera in the light transmissive display region 10a, thereby implementing the under-screen photographing.

Figure 9:
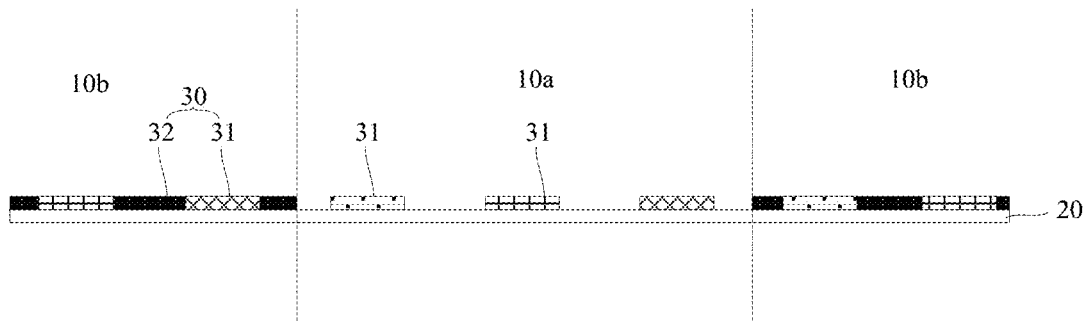
FIG. 9 is a schematic structural diagram of a display panel according to some embodiments of the present disclosure.

FIG. 9 is a schematic structural diagram of a display panel according to some embodiments of the present disclosure. As shown in FIG. 9, in the display panel, the color filter layer 30 includes a plurality of filter blocks 31. The filter blocks 31 are in one-to-one correspondence with the light emitting devices 200. In the light transmissive display region 10a, at least a partial region between the adjacent filter blocks 31 is a light transmissive region, and an orthographic projection of the light transmissive region on the substrate 10 is at least partially outside the orthographic projection of the anode 201 of the light emitting device 200 on the substrate 10.

In the related art, the color filter layer 30 is non-light transmissive except for the portion in the region where the filter block 31 is disposed, so that the ambient light does not pass through the color filter layer 30 from the region between the filter blocks 31, and the display panel does not implement the under-screen photographing. According to the embodiments of the disclosure, in the light-transmissive display region 10a, the region between the adjacent filter blocks 31 is light transmissive and does not block the ambient light incident to the display panel, so that the ambient light passes through the display panel and is received by the under-screen camera.

In the non-light transmissive display region 10b, at least a partial region of the color filter layer 30 is a non-light transmissive region, and an orthographic projection of the non-light transmissive region on the substrate 10 at least partially overlaps with the orthographic projection of the light emitting device 200 on the substrate 10. For example, as shown in FIG. 9, the color filter layer 30 further includes a second light shielding layer 32 which is disposed in the non-light transmissive display region 10b and between the adjacent filter blocks 31. The under-screen camera is arranged corresponding to the light transmissive display region 10a, while in the non-transmissive display region 10b, the second light shielding layer 32 shields the region between the adjacent filter blocks 31 and does not interfere with photographing of the under-screen camera. The second light shielding layer 32 blocks the light reflected by the anode 201, thereby avoiding glare caused by strong reflection of ambient light by the anode 201.

Since the area of the light transmissive display region 10a only needs to ensure the normal operation of the under-screen camera, the area of the light transmissive display region 10a is generally much smaller than the area of the non-transmissive display region 10b. Even if the second light shielding layer 32 is only arranged in the non-light transmissive display region 10b to shield the anode 201 in the non-light transmissive display region 10b, without shielding the anode 201 in the light transmissive display region 10a, the intensity of reflection from the anode 201 in the light transmissive display region 10a is so limited that the region where glare is generated is also small, which basically does not affect the normal use of the display panel.

Figure 10:
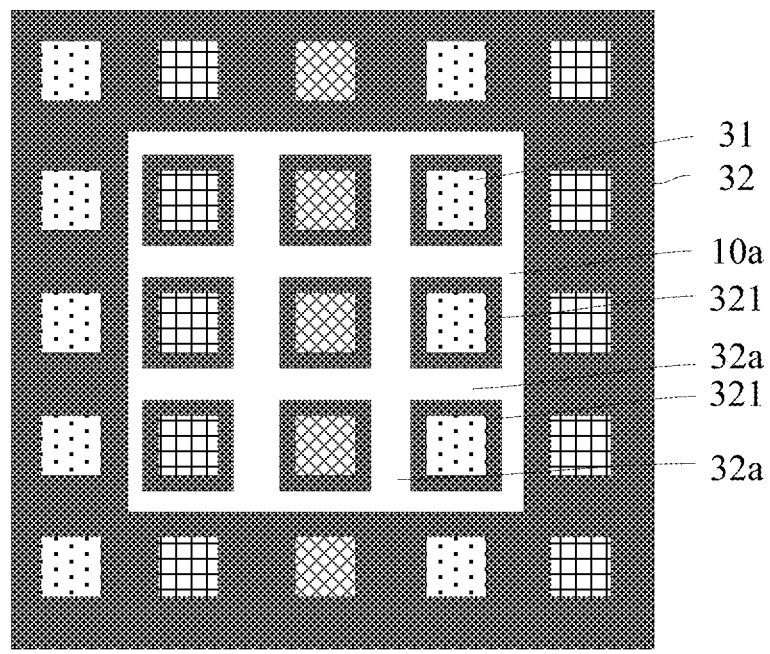
FIG. 10 is a partial top view of a color filter layer according to some embodiments of the present disclosure.

FIG. 10 is a partial top view of a color filter layer according to some embodiments of the present disclosure. Compared to the color filter layer shown in FIG. 9, in the color filter layer of FIG. 10, the second light shielding layer 32 of the color filter layer 30 is further disposed in the light transmissive display region 10a and between the adjacent filter blocks 31. As shown in FIG. 10, the second light shielding layer 32 includes a plurality of second slits 32a, and the second slit 32a is at least disposed in the light transmissive display region 10a and between the adjacent filter blocks 31, and an orthographic projection of the second slit 32a on the substrate does not overlap with the orthographic projection of the anode 201 of the light emitting device 200 on the substrate 10.

A portion of the second light-shielding layer 32 is disposed in the light transmissive display region 10a, so that the second light shielding layer 32 also shields the anode 201 disposed in the light transmissive display region 10a, thereby further decreasing the reflection of ambient light by the anode 201. In addition, the second slit 32a is able to transmit light, so that ambient light still passes through the light transmissive display region 10a, which ensures that the display panel still implements the under-screen photographing.

An area of the orthographic projection of the light emitting device 200 disposed in the light transmissive display region 10a on the substrate 10 is less than an area of the orthographic projection of the light emitting device 200 disposed in the non-light transmissive display region 10b on the substrate 10. Therefore, in the light transmissive display region 10a, there is space to arrange the second slit 32a with a larger width, and the total area of the second slits 32a in the light transmissive display region 10a is increased, so that the under-screen camera receives more ambient light and the effect of the under-screen photographing is improved.

As shown in FIG. 10, in the light transmissive display region 10a, the plurality of second slits 32a intersect to form a mesh pattern, and the second light shielding layer 32 includes a plurality of third light shielding blocks 321 divided by the plurality of second slits 32a intersecting in the mesh pattern.

In the light transmissive display region 10a, the third light shielding blocks 321 are in one-to-one correspondence with the anodes 201 of the light emitting devices 200, and the ambient light passes through the color filter layer 30 from the region between the adjacent third light shielding blocks 321, and the anode 201 is shielded by the third light shielding block 321 to decrease reflection by the anode 201.

Optionally, in the light transmissive display region 10a, an outer contour of the orthographic projection of the anode 201 on the substrate 10 is within an orthographic projection of the third light shielding block 321 on the substrate 10.

In the embodiments of the present disclosure, the orthographic projection of the third light shielding block 321 on the substrate 10 is ring-shaped, so that the third light shielding block 321 shields a whole circumference of the anode 201 to further avoid the glare phenomenon.

In the embodiments of the disclosure, a ring shape is a closed figure having an inner profile and an outer contour, which is not a special circular ring shape, and includes but is not limited to a circular ring, an elliptical ring, and a rectangular frame. The shape of the inner profile and the shape of the outer contour of the third light shielding block 321 are the same as the shape of the anode 201. For example, in the embodiments of the disclosure, the anode is rectangular and the inner profile and outer contour of the third light shielding block 321 are both rectangular frames.

In some examples, the third light shielding block 321 is made from a non-transparent material, such as a non-light transmissive resin material. In other examples, the third light shielding block 321 includes a non-light transmissive coating. Exemplarily, the non-light transmissive coating is formed of ink.

Figure 11:
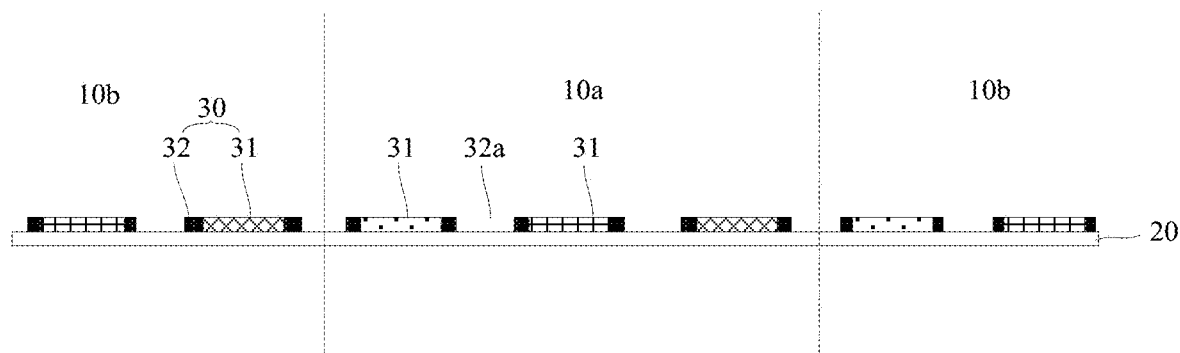
FIG. 11 is a schematic diagram of a partial structure of a color filter layer according to some embodiments of the present disclosure.

In the non-light transmissive display region 10b, the region, between the adjacent filter blocks 31, of the color filter layer 30 is fully transparent, partially transparent or fully non-transparent. In the non-light transmissive display region 10b, the region, between the adjacent filter blocks 31, of the color filter layer 30 is non-transparent, which decreases the reflection of ambient light by the anode 201 and avoids glare. As examples, the pixel definition layers 22 shown in FIGS. 9 and 10 are fully non-transparent in the non-light transmissive display region 10b. The pixel definition layer 22 shown in FIG. 11 is partially transparent in the non-light transmissive display region 10b.

Figure 12:
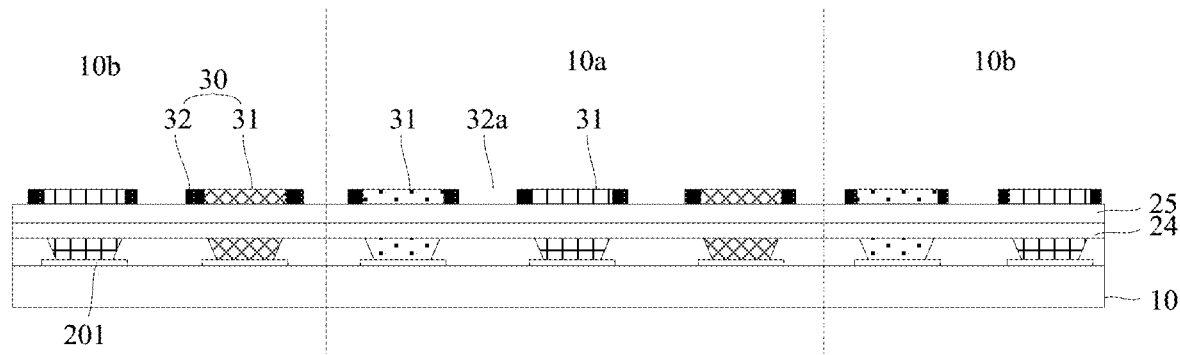
FIG. 12 is a schematic diagram of a partial structure of a display panel according to some embodiments of the present disclosure.
Figure 13:
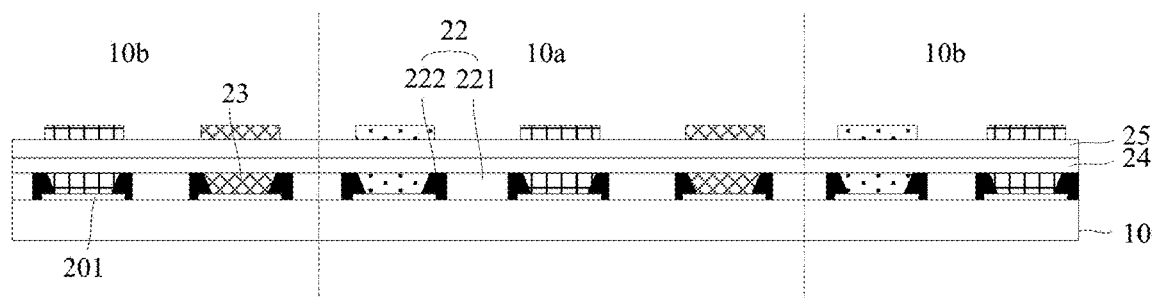
FIG. 13 is a schematic diagram of a partial structure of a display panel according to some embodiments of the present disclosure.

The aforementioned display layer 20 and the color filter layer 30 are combined to obtain the display panel as shown in FIG. 12. The display layer 20 includes but is not limited to the display layer 20 shown in any one of FIGS. 3 to 8, and the color filter layer 30 includes but is not limited to the color filter layer 30 shown in any one of FIGS. 9 to 11. For example, the display layer 20 shown in FIG. 3 is combined with the color filter layer 30 shown in FIG. 11 to obtain the display panel as shown in FIG. 12. The display layer 20 shown in FIG. 5 is also combined with the color filter layer 30 without the second light shielding layer 32 to obtain the display panel as shown in FIG. 13. By combining the display layer 20 with the color filter layer 30, in the light transmissive display region 10a, at least a partial region of the display panel disposed between the adjacent anodes 201 of display layer 20 transmits light, while in the non-light transmissive display region 10b, at least a partial region of the display panel disposed between the adjacent anodes 201 of the display layer 20 does not transmit light. Ambient light passes through the light transmissive region between the adjacent anodes 201 in the light transmissive display region 10a and is received by the under-screen camera, so that the under-screen camera operates normally. While the non-light transmissive region of the display panel blocks the ambient light and decrease the reflection of ambient light by the anodes 201, thereby avoiding glare.

Figure 14:
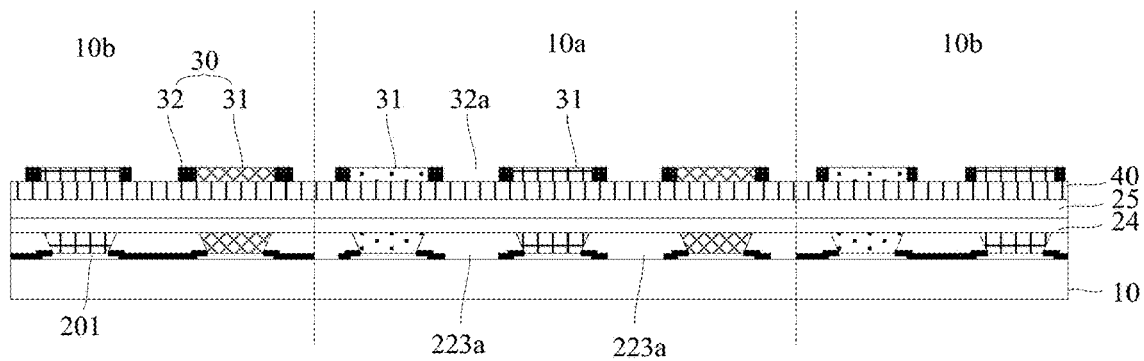
FIG. 14 is a schematic structural diagram of a display panel according to some embodiments of the present disclosure.
Figure 15:
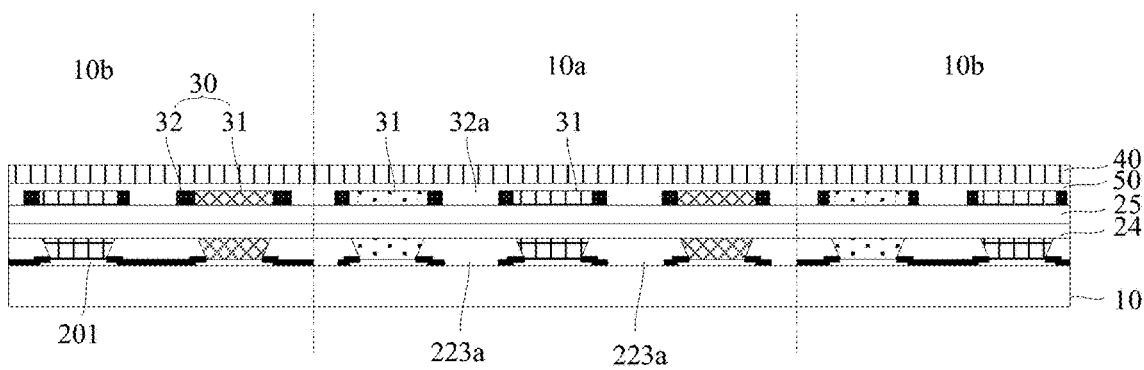
FIG. 15 is a schematic structural diagram of another display panel according to some embodiments of the present disclosure.

FIG. 14 is a schematic structural diagram of a display panel according to some embodiments of the present disclosure. The display panel includes a display layer 20 shown in FIG. 7 and a color filter layer 30 shown in FIG. 11. As shown in FIG. 14, the display panel further includes a touch layer 40. The touch layer 40 is disposed between the display layer 20 and the color filter layer 30. FIG. 15 is a schematic structural diagram of another display panel according to some embodiments of the present disclosure. As shown in FIG. 15, the touch layer 40 of the display panel is disposed on a side, distal from the display layer 20, of the color filter layer 30. The display panel realizes a touch function by providing the touch layer 40.

As shown in FIG. 15, the display panel shown in FIG. 15 further includes a planarization layer 50, and the planarization layer 50 is disposed between the color filter layer 30 and the touch layer 40. The planarization layer 50 provides a flat surface to facilitate the arrangement of the touch layer 40.

Figure 16:
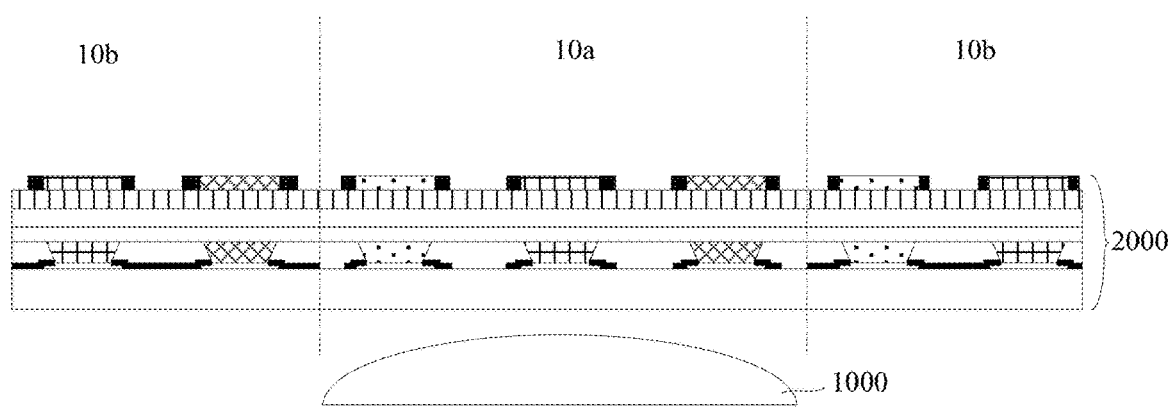
FIG. 16 is a schematic structural diagram of a display device according to some embodiments of the present disclosure.

FIG. 16 is a schematic structural diagram of a display device according to some embodiments of the present disclosure. The display device is, but is not limited to, a cell phone, a tablet computer, a laptop computer. As shown in FIG. 16, the display device includes a camera module 1000 and a display panel 2000 shown in FIG. 14. The camera module 1000 is disposed on a side, distal from the color filter layer 30, of the substrate 10, and is opposite to the light transmissive display region 10a of the display panel 2000. In other examples, the display panel of the display device includes, but is not limited to, the display layer 20 shown in any one of FIGS. 3 to 8 and the color filter layer 30 shown in any one of FIGS. 9 to 11.

Since in the light transmissive display region, at least a partial region of the display panel disposed between the adjacent light emitting devices is transparent and is capable of transmitting light, the camera is arranged at a position, corresponding to the light transmissive display region, on the back of the display panel when the camera is arranged, which realizes the under-screen camera function and increases the screen-to-body ratio.

Figure 17:
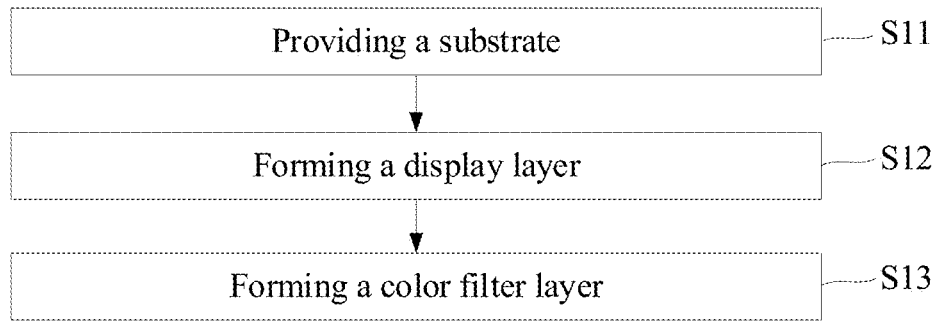
FIG. 17 is a flowchart of a method for manufacturing a display panel according to some embodiments of the present disclosure.

FIG. 17 is a flowchart of a method for manufacturing a display panel according to some embodiments of the present disclosure. The method is used to manufacture any of the display panels described above. As shown in FIG. 17, the manufacturing method includes the following steps.

In step S11, a substrate 10 is provided.

The substrate 10 includes a light transmissive display region 10a and a non-light transmissive display region 10b. In some embodiments, the substrate 10 is an array substrate.

In step S12, a display layer 20 is formed.

The display layer 20 is disposed on a side of the substrate 10, and the display layer 20 includes a plurality of light emitting devices 200.

In step S13, a color filter layer 30 is formed.

The color filter layer 30 is disposed on the side, distal from the substrate 10, of the display layer 20; and in the light transmissive display region 10a, at least a partial region of the display panel disposed between the anodes 201 of the adjacent light emitting devices 200 of the display layer 20 is light transmissive.

Since in the light transmissive display region, at least a partial region of the display panel disposed between the adjacent light emitting devices is transparent and is capable of transmitting light, the camera is arranged at a position, corresponding to the light transmissive display region, on the back of the display panel when the camera is arranged, which realizes the under-screen camera function and increases the screen-to-body ratio.

The method for manufacturing the display panel includes a method for manufacturing a display layer and a method for manufacturing a color filter layer. For display layers with different The structures, the corresponding manufacturing methods are also different. For color filter layers with different structures, the corresponding manufacturing methods are also different.

Figure 18:
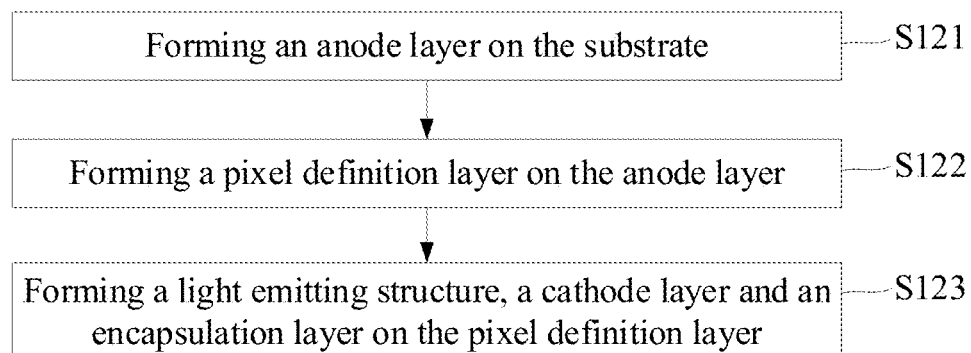
FIG. 18 is a flowchart of a method for manufacturing a display layer according to some embodiments of the present disclosure.

FIG. 18 is a flowchart of a method for manufacturing a display layer according to some embodiments of the present disclosure. The method is at least used to manufacture any of the display layers shown in FIGS. 3 to 8. As shown in FIG. 18, the manufacturing method includes the following steps.

In step S121, an anode layer 21 is formed on the substrate 10.

The anode layer 21 includes a plurality of anodes 201 arranged in an array. The anode layer 21 is manufactured by vapor deposition, sputtering, deposition, or the like. For the specific manufacturing process of the anode layer 21, reference is made to the related technology and details are not repeated herein.

In step S122, a pixel definition layer 22 is formed on the anode layer 21.

Figure 19:
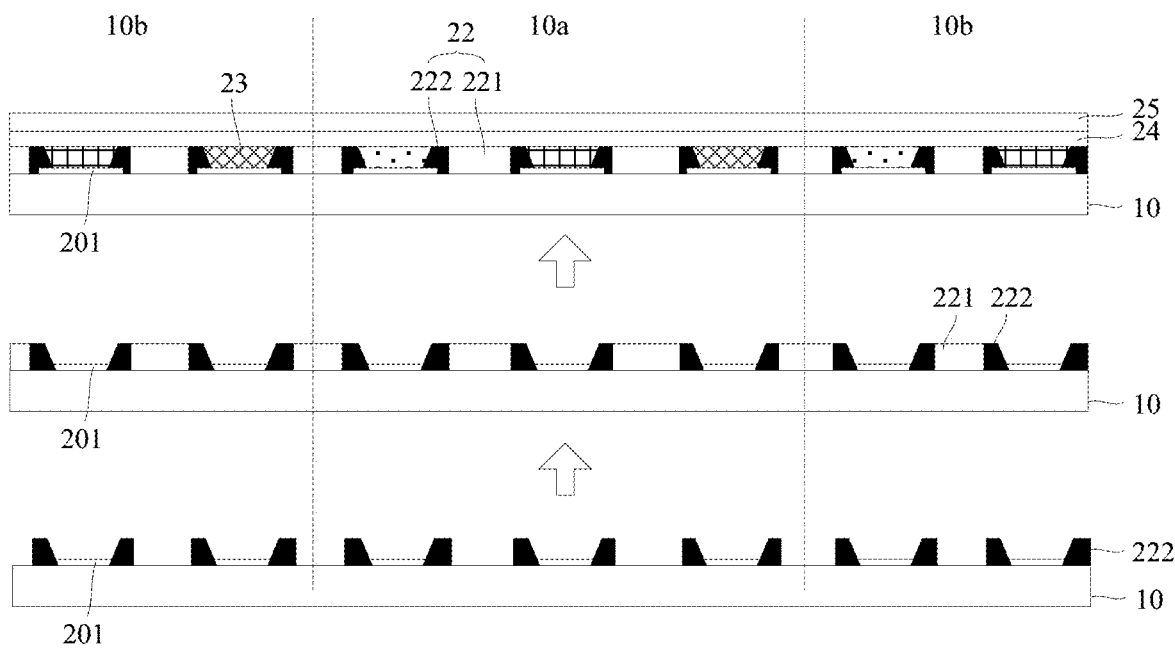
FIG. 19 is a schematic diagram of a process for manufacturing a display layer according to some embodiments of the present disclosure.

With respect to the pixel definition layer 22 shown in FIG. 15, the pixel definition layer 22 includes a body 221 and a first light shielding block 222, and the first light shielding block 222 is made from a non-light transmissive material. Referring to FIG. 19, when the pixel definition layer 22 is formed, the first light shielding block 222 is formed on the anode layer 21 before the body 221 is formed. In other embodiments of the present disclosure, the body 221 is formed first and then the first light shielding block 222 is formed.

For example, a plurality of first light shielding blocks are first formed on the anode layer 21 by a patterning process, and an orthographic projection of the first light shielding block 222 on the substrate 10 partially overlaps with the orthographic projection of the anode 201 on the substrate 10. The body 221 is then formed in the region between the adjacent first light shielding blocks 222 by the patterning process.

Figure 20:
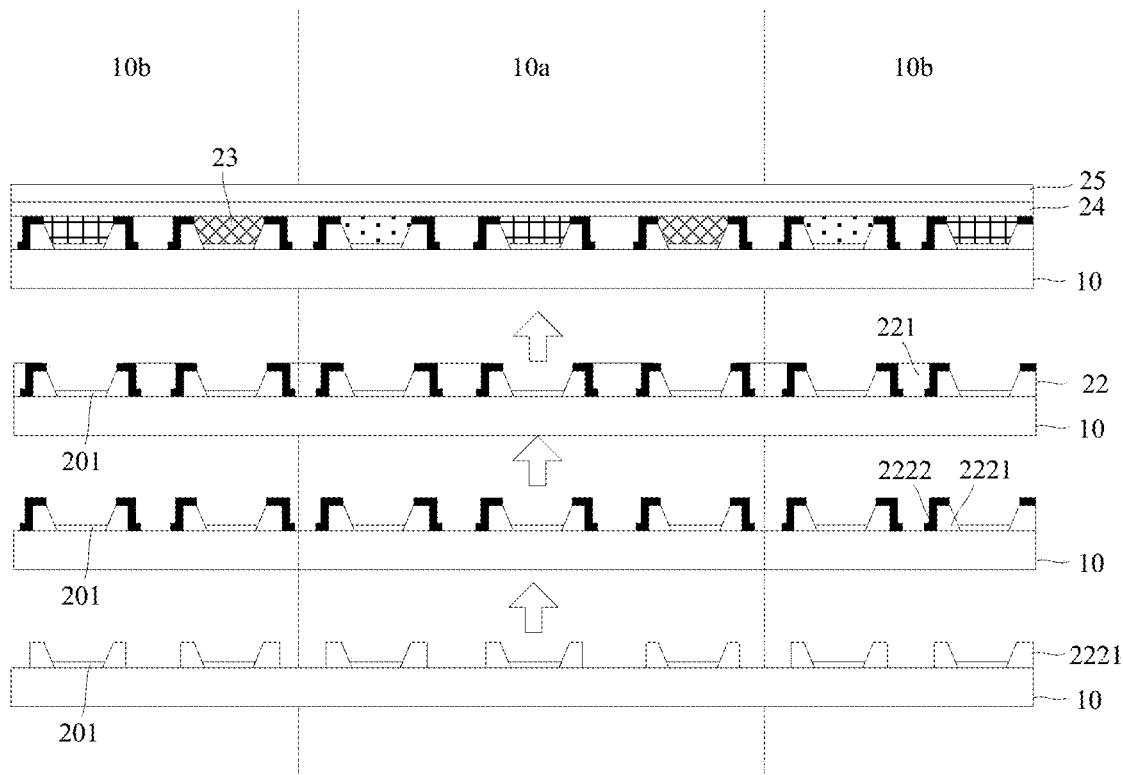
FIG. 20 is a schematic diagram of a process for manufacturing a display layer according to some embodiments of the present disclosure.

With respect to the pixel definition layer 22 shown in FIG. 6, the first light shielding block 222 includes a light transmissive body 2221 and a non-light transmissive coating 2222. Referring to FIG. 20, when this pixel definition layer 22 is formed, the light transmissive body 2221 is first formed on the anode layer 21, and then the non-light transmissive coating 2222 is formed on the surface of the light transmissive body 2221. In other embodiments of the present disclosure, the non-light transmissive coating 2222 is formed first on the surface of the anode layer 21, and then the light transmissive body 2221 is formed on the non-light transmissive coating 2222.

Exemplarily, the light transmissive body 2221 is formed by the patterning process and the non-light transmissive coating 2222 is formed by printing.

Figure 21:
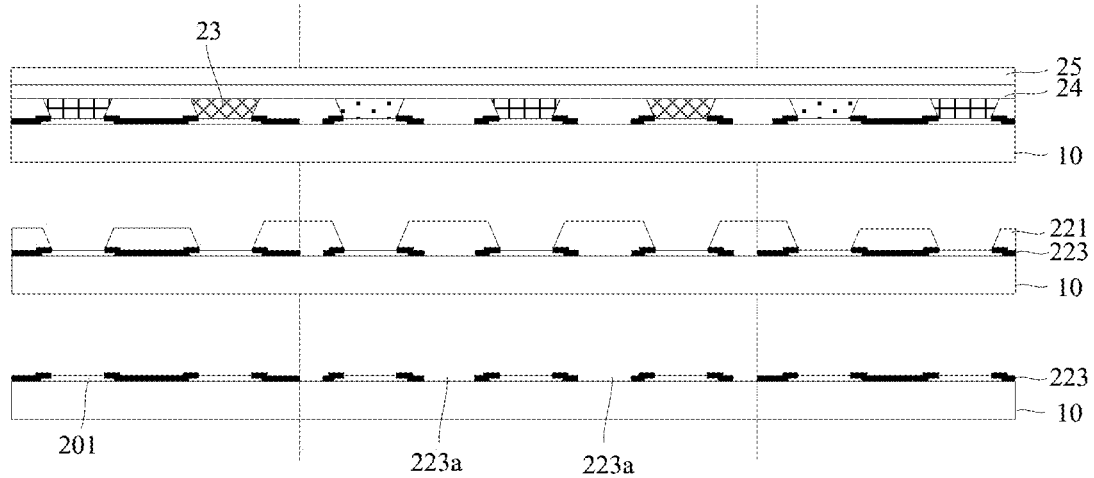
FIG. 21 is a schematic diagram of a process for manufacturing a display layer according to some embodiments of the present disclosure.

With respect to the pixel definition layer 22 shown in FIG. 7, the pixel definition layer 22 includes a body 221 and a first light shielding layer 223. Referring to FIG. 21, when the pixel definition layer 22 is formed, the first light shielding layer 223 is first formed on the surface of the anode layer 21, and then the body 221 is formed on the first light shielding layer 223. In other embodiments of the present disclosure, the body 221 is formed first on the anode layer 21, and then the first light shielding layer 223 is formed on the surface of the body 221.

Exemplarily, the body 221 is formed by a patterning process and the first light shielding layer 223 is formed by printing.

In step S123, a plurality of light emitting structure 23, a cathode layer 24 and an encapsulation layer 25 are formed on the pixel definition layer 22.

For the specific manufacturing process of the light emitting structure 23, the cathode layer 24, and the encapsulation layer 25, reference is made referred to related technology and details are not repeated herein. Exemplarily, the cathode layer 24 is formed by vapor deposition, sputtering, or deposition, and then the encapsulation layer 25 is formed on the cathode layer 24.

Figure 22:
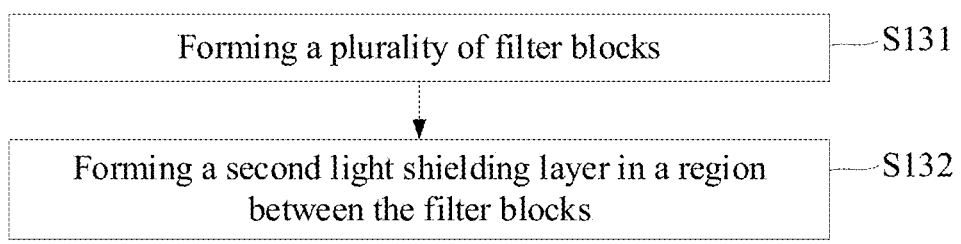
FIG. 22 is a flowchart of a method for manufacturing a color filter film according to some embodiments of the present disclosure.

FIG. 22 is schematic diagram of a process for manufacturing a color filter film according to some embodiments of the present disclosure. The method is at least used to manufacture any of the color filter layers shown in FIGS. 9 to 11. As shown in FIG. 22, the manufacturing method includes the following steps.

In step S131, a plurality of filter blocks 31 are formed on the display layer 20.

The filter blocks 31 are in one-to-one correspondence with the light emitting devices 200 of the display layer 20. For the specific manufacturing process of the filter blocks 31, reference is made to related technology and details are not repeated herein.

In step S132, a second light shielding layer 32 is formed in a region between the adjacent filter blocks.

With respect to the color filter layer 30 shown in FIG. 9, the second light shielding layer 32 is disposed in the non-light transmissive display region 10b. With respect to the color filter layer 30 shown in FIG. 10, the second light shielding layer 32 is further disposed in the light transmissive display region 10a and the second light shielding layer 32 includes a plurality of second slits 32a. When the color filter layer 30 shown in FIG. 9 or 10 is manufactured, the second light shielding layer 32 is manufactured by the patterning process.

In some embodiments of the present disclosure, in the case that the second light shielding layer 32 is a non-light transmissive coating, the second light shielding layer 32 is also manufactured by printing.

Described above are merely optional embodiments of the present disclosure, and are not intended to limit the present disclosure. Any modifications, equivalent substitutions, improvements, and the like made within the spirit and principles of the present disclosure shall be included in the protection scope of the present disclosure.

What is claimed is:

1. A display panel, comprising: a substrate, a display layer, and a color filter layer; wherein
the display layer is disposed on a side of the substrate and comprises a plurality of light emitting devices;
the color filter layer is disposed on a side, distal from the substrate, of the display layer;
the substrate comprises a light transmissive display region; wherein in the light transmissive display region, at least a partial region of the display panel disposed between the adjacent light emitting devices is light transmissive; and
the color filter layer comprises a plurality of filter blocks and a second light shielding layer; wherein
in the light transmissive display region, at least a partial region between the adjacent filter blocks is a light transmissive region, and an orthographic projection of the light transmissive region on the substrate is at least partially outside the orthographic projection of an anode of the light emitting device on the substrate;
the second light shielding layer is at least disposed in the light transmissive display region, and between the adjacent filter blocks; and
the second light shielding layer comprises a plurality of second slits, wherein the second slit is at least disposed in the light transmissive display region and between the adjacent filter blocks, and an orthographic projection of the second slit on the substrate does not overlap with the orthographic projection of the anode on the substrate.

2. The display panel according to claim 1, wherein the display layer further comprises a pixel definition layer, wherein
the pixel definition layer comprises a body and a plurality of first light shielding blocks, and the body is provided with a plurality of openings which are in one-to-one correspondence with anodes of the light emitting devices; and
in the light transmissive display region, an orthographic projection of the anode on the substrate is within an orthographic projection of the corresponding opening on the substrate; at least a portion of the first light shielding block is disposed within the opening, and an orthographic projection of the first light shielding block on the substrate partially overlaps with the orthographic projection of the anode on the substrate.

3. The display panel according to claim 2, wherein an outer contour of the orthographic projection of the anode on the substrate is within the orthographic projection of the first light shielding blocks on the substrate.

4. The display panel according to claim 2, wherein
the first light shielding block is made from a non-light transmissive material; or,
the first light shielding block comprises a light transmissive body and a non-light transmissive coating, and the non-light transmissive coating is at least disposed on a surface, proximate to and/or distal from the substrate, of the light transmissive body.

5. The display panel according to claim 1, wherein the display layer further comprises a pixel definition layer, the pixel definition layer comprising a body and a first light shielding layer; wherein
the body is provided with a plurality of openings which are in one-to-one correspondence with anodes of the light emitting devices and an orthographic projection of the opening on the substrate is within an orthographic projection of the corresponding anode on the substrate;
the first light shielding layer is disposed on a surface, proximate to and/or distal from the substrate, of the body, and an orthographic projection of the first light shielding layer on the substrate partially overlaps with the orthographic projection of the anode on the substrate; and
the first light shielding layer comprises a plurality of first slits, wherein the first slit is at least disposed in the light transmissive display region and between the adjacent openings; and an orthographic projection of the first slit on the substrate does not overlap with the orthographic projection of the anode on the substrate.

6. The display panel according to claim 5, wherein in the light transmissive display region, the plurality of first slits intersect to form a mesh pattern, and the first light shielding layer.

7. The display panel according to claim 6, wherein in the light transmissive display region, an outer contour of the orthographic projection of the anode on the substrate is within an orthographic projection of the second light shielding block on the substrate.

8. The display panel according to claim 1, wherein in the light transmissive display region, the plurality of second slits intersect to form a mesh pattern, and the second light shielding layer comprises a plurality of third light shielding blocks divided by the plurality of second slits intersecting in the mesh pattern.

9. The display panel according to claim 8, wherein in the light transmissive display region, an outer contour of the orthographic projection of the anode on the substrate is within an orthographic projection of the third light shielding block on the substrate.

10. The display panel according to claim 1, wherein the substrate further comprises a non-light transmissive display region; wherein
in the non-light transmissive display region, at least a partial region of a pixel definition layer is a non-light transmissive region, and an orthographic projection of the non-light transmissive region on the substrate at least partially overlaps with an orthographic projection of the light emitting device on the substrate.

11. The display panel according to claim 1, wherein the substrate further comprises a non-light transmissive display region; wherein
in the non-light transmissive display region, at least a partial region of the color filter layer is a non-light transmissive region, and an orthographic projection of the non-light transmissive region on the substrate at least partially overlaps with an orthographic projection of the light emitting device on the substrate.

12. The display panel according to claim 1, further comprising a touch layer; wherein
the touch layer is disposed between the display layer and the color filter layer, or disposed on a side, distal from the display layer, of the color filter layer.

13. A method for manufacturing a display panel, comprising:
providing a substrate, the substrate comprising a light transmissive display region and a non- light transmissive display region;
forming a display layer, the display layer being disposed on a side of the substrate and comprising a plurality of light emitting devices; and
forming a color filter layer, the color filter layer being disposed on a side, distal from the substrate, of the display layer; wherein
in the light transmissive display region, at least a partial region of the display panel disposed between anodes of the adjacent light emitting devices is light transmissive;
the color filter layer comprises a plurality of filter blocks and a second light shielding layer;
in the light transmissive display region, at least a partial region between the adjacent filter blocks is a light transmissive region, and an orthographic projection of the light transmissive region on the substrate is at least partially outside the orthographic projection of the anode of the light emitting device on the substrate;
the second light shielding layer is at least disposed in the light transmissive display region, and between the adjacent filter blocks; and
the second light shielding layer comprises a plurality of second slits, wherein the second slit is at least disposed in the light transmissive display region and between the adjacent filter blocks, and an orthographic projection of the second slit on the substrate does not overlap with the orthographic projection of the anode on the substrate.

14. A display device, comprising a camera module and a display panel, wherein
the display panel comprises:
a substrate, a display layer, and a color filter layer; wherein
the display layer is disposed on a side of the substrate and comprises a plurality of light emitting devices;
the color filter layer is disposed on a side, distal from the substrate, of the display layer;
the substrate comprises a light transmissive display region;
in the light transmissive display region, at least a partial region of the display panel disposed between the adjacent light emitting devices is light transmissive;
the color filter layer comprises a plurality of filter blocks and a second light shielding layer;
in the light transmissive display region, at least a partial region between the adjacent filter blocks is a light transmissive region, and an orthographic projection of the light transmissive region on the substrate is at least partially outside the orthographic projection of the anode of the light emitting device on the substrate;
the second light shielding layer is at least disposed in the light transmissive display region, and between the adjacent filter blocks;
the second light shielding layer comprises a plurality of second slits, wherein the second slit is at least disposed in the light transmissive display region and between the adjacent filter blocks, and an orthographic projection of the second slit on the substrate does not overlap with the orthographic projection of the anode on the substrate; and
the camera module is disposed on a side, distal from the color filter layer, of the substrate, and is opposite to the light transmissive display region of the display panel.

15. The display device according to claim 14, wherein the display layer further comprises a pixel definition layer, wherein
the pixel definition layer comprises a body and a plurality of first light shielding blocks, and the body is provided with a plurality of openings which are in one-to-one correspondence with anodes of the light emitting devices; and
in the light transmissive display region, an orthographic projection of the anode on the substrate is within an orthographic projection of the corresponding opening on the substrate; at least a portion of the first light shielding block is disposed within the opening, and an orthographic projection of the first light shielding block on the substrate partially overlaps with the orthographic projection of the anode on the substrate.

16. The display device according to claim 15, wherein an outer contour of the orthographic projection of the anode on the substrate is within the orthographic projection of the first light shielding blocks on the substrate.

17. The display device according to claim 15, the first light shielding block is made from a non-light transmissive material; or, the first light shielding block comprises a light transmissive body and a non-light transmissive coating, and the non-light transmissive coating is at least disposed on a surface, proximate to and/or distal from the substrate, of the light transmissive body.

18. The display device according to claim 14, wherein the display layer further comprises a pixel definition layer, the pixel definition layer comprising a body and a first light shielding layer; wherein the body is provided with a plurality of openings which are in one-to-one correspondence with anodes of the light emitting devices and an orthographic projection of the opening on the substrate is within an orthographic projection of the corresponding anode on the substrate;

the first light shielding layer is disposed on a surface, proximate to and/or distal from the substrate, of the body, and an orthographic projection of the first light shielding layer on the substrate partially overlaps with the orthographic projection of the anode on the substrate; and the first light shielding layer comprises a plurality of first slits, wherein the first slit is at least disposed in the light transmissive display region and between the adjacent openings; and an orthographic projection of the first slit on the substrate does not overlap with the orthographic projection of the anode on the substrate.

* * * * *